US010355175B2

(12) United States Patent
Lee et al.

(10) Patent No.: US 10,355,175 B2
(45) Date of Patent: Jul. 16, 2019

(54) LIGHT EMITTING DEVICE

(71) Applicant: Panasonic Intellectual Property Management Co., Ltd., Osaka (JP)

(72) Inventors: Youshin Lee, Osaka (JP); Shozo Oshio, Osaka (JP); Tatsuya Okuno, Osaka (JP); Takeshi Abe, Osaka (JP); Masahiro Nakamura, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/071,906

(22) PCT Filed: Jan. 31, 2017

(86) PCT No.: PCT/JP2017/003348
§ 371 (c)(1),
(2) Date: Jul. 22, 2018

(87) PCT Pub. No.: WO2017/154413
PCT Pub. Date: Sep. 14, 2017

(65) Prior Publication Data
US 2019/0027656 A1  Jan. 24, 2019

(30) Foreign Application Priority Data
Mar. 10, 2016  (JP) .................... 2016-046722

(51) Int. Cl.
*H01J 1/62* (2006.01)
*H01L 33/50* (2010.01)
(Continued)

(52) U.S. Cl.
CPC ............ *H01L 33/502* (2013.01); *C09K 11/08* (2013.01); *F21S 2/00* (2013.01); *F21V 9/30* (2018.02);
(Continued)

(58) Field of Classification Search
None
See application file for complete search history.

(56) References Cited

U.S. PATENT DOCUMENTS 4,225,653 A * 9/1980 Brixner ............. C09K 11/7702
                                                    250/483.1
4,532,070 A * 7/1985 Rabatin ............. C09K 11/777
                                                    250/483.1
(Continued)

FOREIGN PATENT DOCUMENTS

JP    7-187612 A    7/1995
JP    3503139      12/2003
(Continued)

OTHER PUBLICATIONS

International Search Report for corresponding App. No. PCT/JP2017/003348, dated May 9, 2017.
(Continued)

*Primary Examiner* — Vip Patel
(74) *Attorney, Agent, or Firm* — Renner, Otto, Boisselle & Sklar, LLP

(57) ABSTRACT

A light emitting device 1 includes: a substrate 30; and a phosphor layer 40 composed in such a manner that a large number of phosphor particles 60 are adhered onto a flat surface 32 of the substrate 30. At least one of the phosphor particles 60 is a polyhedral phosphor particle 65 that is monodispersed, is derived from a crystal structure of garnet and has facets, and a median particle size $D_{50}$ of the polyhedral phosphor particle 65 is 30 μm or more and a maximum thickness of the phosphor layer 40 or less. It is preferable that at least one of the phosphor particles 60 adhered onto the flat surface 32 of the substrate 30 is the polyhedral phosphor particle 65 that is monodispersed, is derived from the crystal structure of the garnet, and has the facets.

11 Claims, 8 Drawing Sheets

(51) Int. Cl.
    *C09K 11/08* (2006.01)
    *F21S 2/00* (2016.01)
    *G02B 5/20* (2006.01)
    *H01S 5/022* (2006.01)
    *F21V 9/30* (2018.01)
    *H01L 33/16* (2010.01)
    *H01L 33/58* (2010.01)

(52) U.S. Cl.
    CPC ............... *G02B 5/20* (2013.01); *H01L 33/16* (2013.01); *H01L 33/50* (2013.01); *H01L 33/58* (2013.01); *H01S 5/022* (2013.01); *Y02B 20/181* (2013.01)

(56) References Cited

U.S. PATENT DOCUMENTS

| | | | |
|---|---|---|---|
| 4,578,211 A * | 3/1986 | Rabatin | C09K 11/777 252/301.4 H |
| 5,688,480 A | 11/1997 | Mohri | |
| 8,393,745 B2 | 3/2013 | Hikmet | |
| 2004/0061433 A1 | 4/2004 | Izuno | |
| 2012/0057325 A1 | 3/2012 | Hikmet | |
| 2012/0241779 A1 | 9/2012 | Reeh | |
| 2013/0161849 A1 | 6/2013 | Wataya | |
| 2013/0257264 A1 | 10/2013 | Tamaki | |
| 2014/0084323 A1 | 3/2014 | Shimizu | |
| 2015/0083967 A1 | 3/2015 | Watanabe | |
| 2015/0159836 A1 | 6/2015 | Tamaki | |
| 2015/0287587 A1 | 10/2015 | Honda | |
| 2016/0312116 A1 | 10/2016 | Han | |

FOREIGN PATENT DOCUMENTS

| | | |
|---|---|---|
| JP | 3773541 | 2/2006 |
| JP | 2012-524995 | 10/2012 |
| JP | 2013-147643 A | 8/2013 |
| JP | 2013-216800 A | 10/2013 |
| JP | 2013-247067 | 12/2013 |
| JP | 2014-029928 A | 2/2014 |
| JP | 2014-084402 A | 5/2014 |
| JP | 5649202 | 11/2014 |
| JP | 5669855 | 12/2014 |
| JP | 2015-065425 A | 4/2015 |
| JP | 2015-194605 A | 11/2015 |
| WO | 2003/034508 A1 | 4/2003 |
| WO | 2014/073237 | 5/2014 |
| WO | 2014/168306 A1 | 10/2014 |
| WO | 2017/013867 A1 | 1/2017 |

OTHER PUBLICATIONS

Written Opinion for corresponding App. No. PCT/JP2017/003348, dated May 9, 2017.

* cited by examiner

FIG. 8
(a)
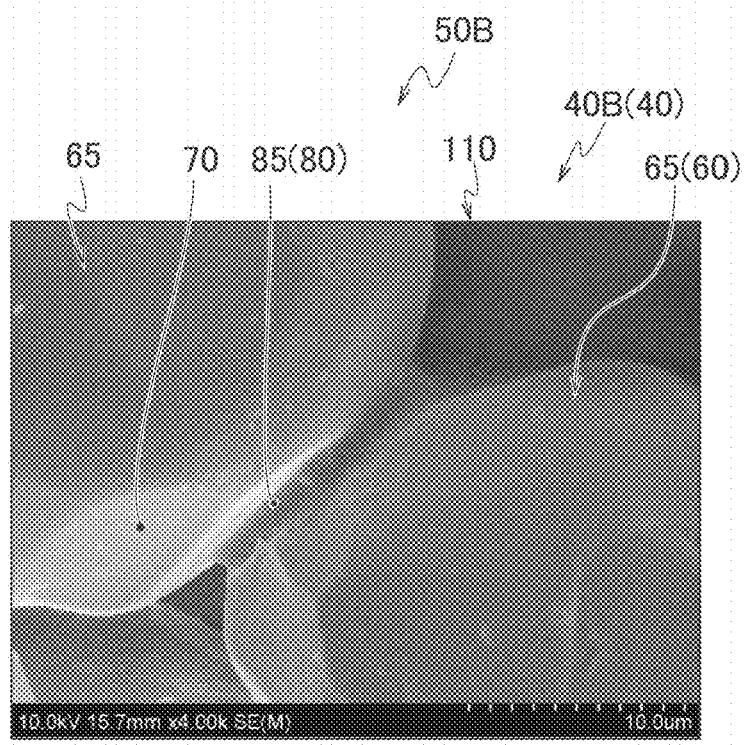
(b)
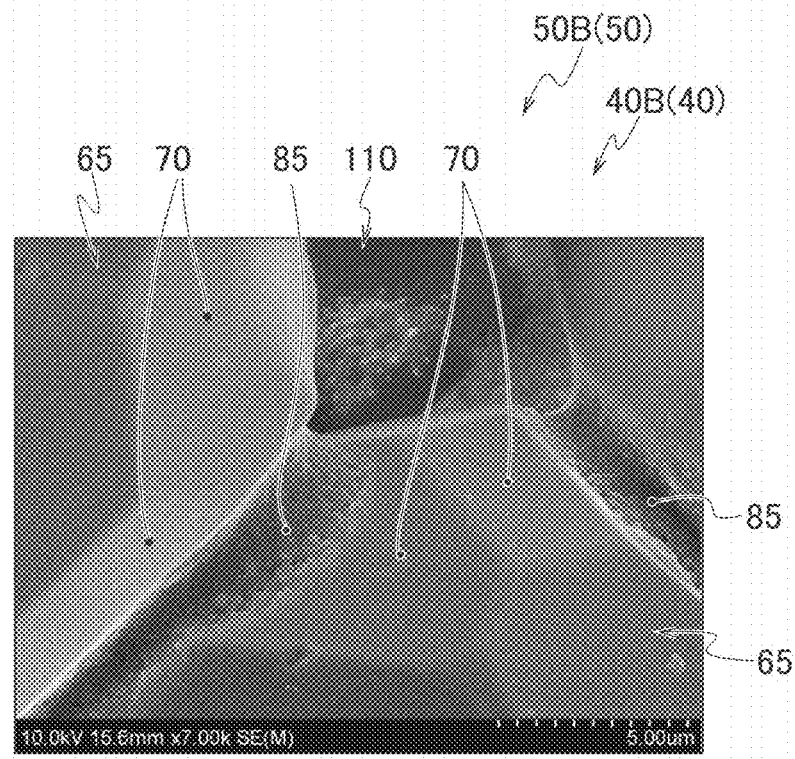

LIGHT EMITTING DEVICE

TECHNICAL FIELD

The present invention relates to a light emitting device including a solid-state light emitting element and a wavelength converter having a phosphor.

BACKGROUND ART

Heretofore, there has been known a light emitting device composed by combining a solid-state light emitting element and a wavelength converter including a phosphor with each other. As such a light emitting device as above, for example, there has been known a white LED light source as described in PTL 1 or a laser lighting device and a laser projector, which are as described in PTL 2 and PTL 3. Note that a large number of light emitting devices, each having a light source that applies a laser beam, have a structure in which phosphor particles are adhered to a flat surface of a substrate having the flat surface, and in general, perform high light density excitation of the phosphor (for example, refer to PTL 6).

In a light emitting device that uses blue light as an excitation source of the phosphor, a garnet-based phosphor activated with $Ce^{3+}$ is frequently used. A typical example of this garnet-based phosphor is a YAG-based phosphor, and is represented by a general formula $Y_3Al_2(AlO_4):Ce^{3+}$. Note that this YAG-based phosphor becomes a phosphor that radiates green light by replacing a part of Al in a crystal lattice thereof by Ga or replacing a part of Y in the crystal lattice by Lu. Moreover, it has also been known that this YAG-based phosphor becomes a phosphor that radiates yellow light by replacing a part of Y in the crystal lattice by Gd (for example, refer to PTLs 1 and 5).

A $Ce^{3+}$-activated amount of the YAG-based phosphor to be used for the light emitting device using the solid-state light emitting element as an excitation source of the phosphor is usually 2 to 3 atomic % with respect to a total number of rare earth ions in the crystal lattice (for example, refer to PTL 1).

Moreover, a particle size (when defined by a median particle size $D_{50}$) of the YAG-based phosphor to be used for the light emitting device using the solid-state light emitting element as an excitation source of the phosphor is usually about 10 μm, and about 25 μm in large (for example, refer to PTLs 4 and 5). Note that a large number of particle shapes of this YAG-based phosphor are shapes derived from a crystal structure of the garnet. It is additionally described that an original shape derived from the crystal structure of the garnet is a polyhedron such as a rhombic dodecahedron and a biased polyhedron. However, the particle shape of the YAG-based phosphor is generally a shape of a pseudo-rhombic dodecahedron or a pseudo-biased polyhedron, in which edge portions are rounded. The particle shape is a spherical shape rather than a polyhedral shape.

In the light emitting device that uses blue light, which is radiated by the solid-state light emitting element, as the excitation source of the phosphor, a $(Y,Gd)_3Al_2(AlO_4):Ce^{3+}$ yellow phosphor in which a part of Y is replaced by Gd is frequently used. This is because white light with a relatively good color tone can be obtained by additive color mixture of the blue light radiated by the solid-state light emitting element and yellow light radiated by this yellow phosphor.

Moreover, a light emitting device has also been known, which is composed by combining a solid-state light emitting element and two or more garnet-based phosphors mutually different in luminescent color and composition and activated by $Ce^{3+}$ for the purpose of controlling a color tone of output light of the light emitting device (for example, refer to PTL 1).

A load on the phosphor has tended to increase year by year as power of the light emitting device has been increasing. In recent years, total mineralization of the wavelength converter has been progressing (refer to PTLs 6 and 7).

CITATION LIST

Patent Literature

PTL 1: Japanese Patent No. 3503139
PTL 2: International Publication No. 2014/073237
PTL 3: English translation of Japanese Unexamined Patent Application Publication No. 2012-524995
PTL 4: Japanese Patent No. 3773541
PTL 5: Japanese Patent No. 5669855
PTL 6: Japanese Unexamined Patent Application Publication No. 2013-247067
PTL 7: Japanese Patent No. 5649202

SUMMARY OF INVENTION

Technical Problem

However, the conventional light emitting device including the solid-state light emitting element and the wavelength converter having the phosphor has had a problem that manufacturing cost thereof is high in the case of using a phosphor or phosphor ceramics, which is composed of a single crystal grown by the Czochralski method. Moreover, the conventional light emitting device including the solid-state light emitting element and the wavelength converter having the phosphor, the light emitting device using the phosphor or the phosphor ceramics, which is composed of this single crystal grown by the Czochralski method, has had a problem that light extraction efficiency thereof is poor and a light emission output thereof is low. Note that it is preferable to use a powder phosphor in order to reduce the manufacturing cost of the light emitting device. However, the light emitting device having a configuration of exciting this powder phosphor in a high light density has had a problem that light emission efficiency thereof is poor and a light emission output thereof is low. The above problem in the case of using the powder phosphor is significantly observed in a light emitting device having a configuration of exciting a phosphor by a laser beam, and in particular, in a light emitting device that radiates a red light component much. The above problem in the case of using the powder phosphor is conceived to occur due to an efficiency decrease (temperature quenching) of the phosphor, which is caused by a temperature rise of the phosphor, the temperature rise following the high light density excitation.

The present invention has been made in consideration of the above problems. It is an object of the present invention to provide a high-output light emitting device with low manufacturing cost, the light emitting device radiating, at high power, the white light suitable for illumination light.

Solution to Problem

In order to solve the above problems, a light emitting device according to an aspect of the present invention includes: a substrate; and a phosphor layer composed in such a manner that a large number of phosphor particles are adhered onto a flat surface of the substrate. At least one of the phosphor particles is a polyhedral phosphor particle that is monodispersed, is derived from a crystal structure of garnet and has facets, and a median particle size $D_{50}$ of the polyhedral phosphor particle is 30 μm or more and a maximum thickness of the phosphor layer or less.

BRIEF DESCRIPTION OF DRAWINGS

FIG. 8 is examples of SEM pictures of the surface of the phosphor layer of the wavelength converter that composes the light emitting device according to Example 2.

DESCRIPTION OF EMBODIMENTS

Figure 1:
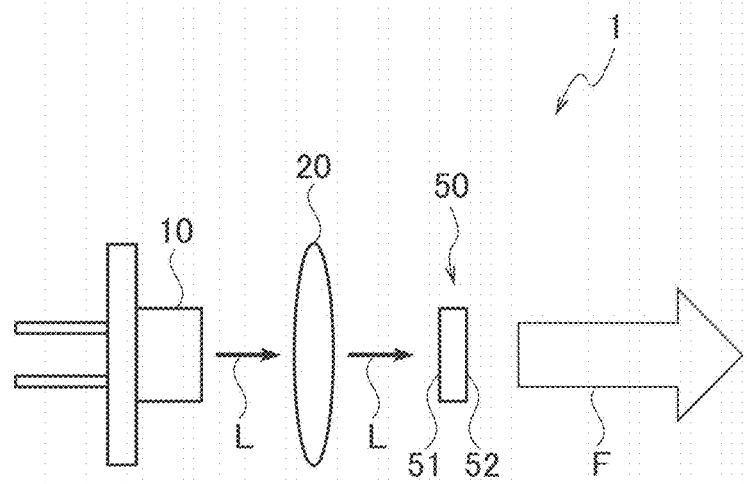
FIG. 1 is a schematic diagram showing a light emitting device according to a first embodiment.

Hereinafter, a detailed description will be given of a light emitting device according to this embodiment with reference to the drawings. FIG. 1 is a schematic diagram showing a light emitting device according to a first embodiment.

Light Emitting Device

First Embodiment

A light emitting device 1 according to the first embodiment includes: a solid-state light emitting element 10; and a wavelength converter 50 having plural types of phosphors which receive primary light radiated by the solid-state light emitting element and radiate light.

Moreover, the light emitting device 1 further includes a lens 20 that condenses the primary light radiated from the solid-state light emitting element 10 to the wavelength converter 50. The lens 20 is provided between the solid-state light emitting element 10 and the wavelength converter 50. As shown in FIG. 1, in the light emitting device 1, the wavelength converter 50 radiates fluorescence F when primary light L radiated from the solid-state light emitting element 10 is made incident onto the wavelength converter 50 via the lens 20. Note that the lens 20 may be eliminated if is not necessary to condense the primary light to the wavelength converter 50. That is, the lens 20 is not an essential constituent for the light emitting device 1. In the light emitting device 1, the plural types of phosphors contained in the wavelength converter 50 are specific.

<Solid-State Light Emitting Element>

The solid-state light emitting element 10 is a solid-state light emitting element that radiates primary light. As such a solid-state light emitting element, for example, a light emitting diode or a laser diode such as a surface light emitting laser diode is used. As shown in FIG. 1, the solid-state light emitting element 10 radiates the primary light L. If the solid-state light emitting element 10 radiates a laser beam, then this is preferable since it is possible to miniaturize the light emitting device 1 and to increase power thereof.

If the primary light has a maximum intensity value within a wavelength region of 420 nm or more and less than 480 nm, preferably 440 nm or more and less than 470 n, then the phosphors contained in the wavelength converter 50 emit light with ease. Moreover, if the primary light has the maximum intensity value within the above wavelength region, then this is preferable since the primary light becomes blue light with good visibility and is usable not only as excitation light for the phosphors but also as output light of the light emitting device 1.

The lens 20 condenses the primary light L radiated from the solid-state light emitting element 10 to the wavelength converter 50. The primary light L is condensed to the wavelength converter 50 via the lens 20. Note that the lens 20 does not need to be provided in the light emitting device if it is not necessary to condense the primary light L to the wavelength converter 50. That is, the lens 20 is not an essential constituent for the light emitting device. Moreover, an optical fiber is also usable in place of the lens 20 as in a light emitting device 1A according to a second embodiment to be described later.

<Wavelength Converter>

The wavelength converter 50 includes the phosphors which receive primary light and radiate light. This embodiment has a feature in the configuration of the wavelength converter 50. The wavelength converter 50 includes: a substrate 30; and a phosphor layer 40 composed in such a manner that a large number of monodispersed phosphor particles 60 are adhered to a flat surface 32 of the substrate 30. Then, in the wavelength converter 50, at least one of the phosphor particles 60 is a polyhedral phosphor particle 65 that is derived from a crystal structure of a garnet and has facets 70. Moreover, in the wavelength converter 50, a median particle size $D_{50}$ of the polyhedral phosphor particle 65 is 30 μm or more and a maximum thickness of the phosphor layer 40 or less. Hereinafter, a description will be given of the wavelength converter 50 with reference to the drawings.

Figure 2:
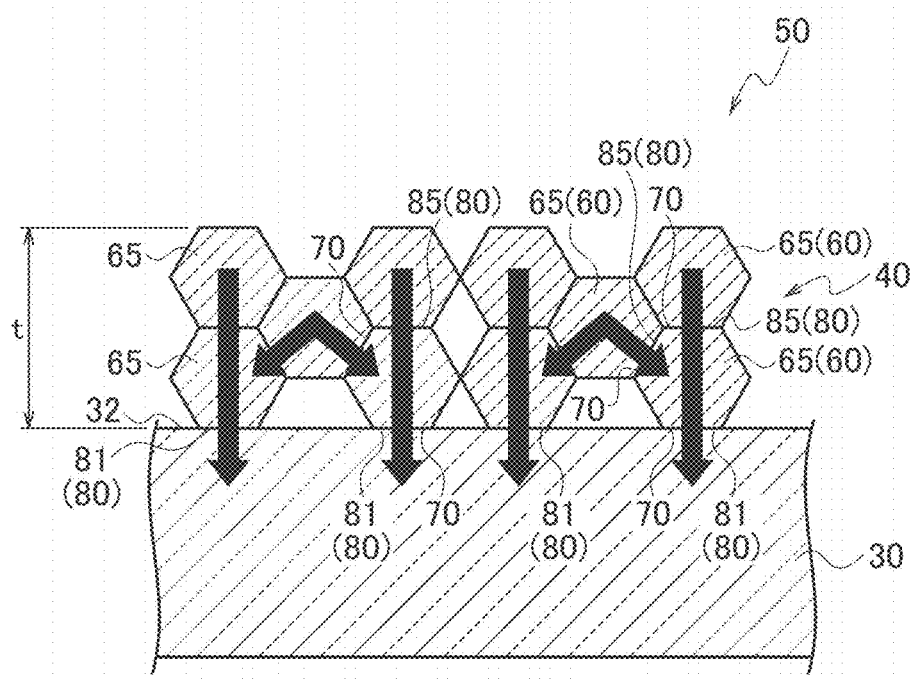
FIG. 2 is a schematic cross-sectional view of a wavelength converter that composes the light emitting device according to the first embodiment.

FIG. 2 is a schematic cross-sectional view of the wavelength converter 50 that composes the light emitting device 1 according to the first embodiment. As shown in FIG. 2, the wavelength converter 50 includes: the substrate 30 that allows permeation of the primary light; and the phosphor layer 40 that is formed on the flat surface 32 of the substrate 30 and composed in such a manner that a large number of phosphor particles 60 are adhered to one another.

[Substrate]

The substrate 30 enables the phosphor layer 40 to be formed on the flat surface 32 thereof. As the substrate 30, a transparent substrate or a metal substrate is usable. As the transparent substrate, for example, a quartz substrate or a translucent phosphor ceramic substrate is used. As the metal substrate, for example, an aluminum substrate is used.

[Phosphor Layer]

In the wavelength converter 50, the phosphor layer 40 is formed on the flat surface 32 of the substrate 30, and is composed in such a manner that a large number of the phosphor particles 60 are adhered to one another.

The phosphor particles 60 are usually adhered to one another by adhesion portions 80 made of a binding agent. Note that the phosphor particles 60 and the transparent substrate 33 are also usually adhered to each other by such adhesion portions 80 made of a binding agent. Among the adhesion portions 80, portions interposed between the phosphor particles 60 are referred to as inter-phosphor particle adhesion portions 85, and portions interposed between the phosphor particles 60 and the transparent substrate 33 are referred to as substrate-phosphor adhesion portions 81. The adhesion portions 80 will be described later in detail. Note that the above adhesion is usually made by thermal diffusion of elements which compose the phosphor particles, mutual fusion of the phosphor particles, melting and solidification of the binding agent interposed between the phosphor particles, intermolecular force of fine particles (nanoparticles and the like) interposed between the phosphor particles, and the like.

In the wavelength converter 50 shown in FIG. 2, all of the phosphor particles 60 which compose the phosphor layer 40 are the polyhedral phosphor particles 65 having the facets 70. Here, the polyhedral phosphor particles 65 mean polyhedral ones, which have the facets 70, among the phosphor particles 60. The polyhedral phosphor particles 65 and non-polyhedral ones among the phosphor particles 60 have the same composition though are different from each other in shape. Note that, in the light emitting device 1 of this embodiment, in place of the wavelength converter 50 shown in FIG. 2, a wavelength converter is also usable, in which at least one of the phosphor particles 60 adhered onto the flat surface 32 of the substrate 30 is the polyhedral phosphor particle 65.

As shown in FIG. 2, in the wavelength converter 50, the flat facets 70 of the polyhedral phosphor particles 65 and the flat surface 32 of the substrate 30 are adhered to each other in a surface contact manner via the adhesion portions 80 (the substrate-phosphor adhesion portions 81). That is, the wavelength converter 50 of the light emitting device 1 includes the substrate-phosphor adhesion portions 81 which adhere the flat surface 32 of the substrate 30 and the facets 70 of the polyhedral phosphor particles 65 in the phosphor layer 40 to each other.

Moreover, in the wavelength converter 50, the flat facets 70 of the adjacent polyhedral phosphor particles 65 are adhered to one another in a surface contact manner via the adhesion portions 80 (the inter-phosphor particle adhesion portions 85). That is, the wavelength converter 50 of the light emitting device 1 includes the inter-phosphor particle adhesion portions 85 which adhere the facets 70 of the adjacent polyhedral phosphor particles 65 to one another.

As described above, the wavelength converter 50 of the light emitting device 1 includes the substrate-phosphor adhesion portions 81 and the inter-phosphor particle adhesion portions 85. The substrate-phosphor adhesion portions 81 adheres the flat surface 32 of the substrate 30 and the facets 70 of the phosphor particles 65 to each other in a surface contact manner, and the inter-phosphor particle adhesion portions 85 adheres the facets 70 of the adjacent phosphor particles 65 to one another in a surface contact manner.

Therefore, in the wavelength converter 50 shown in FIG. 2, improved are heat propagation between the flat surface 32 of the substrate 30 and the polyhedral phosphor particles 65 which compose the phosphor layer 40 and heat propagation between the adjacent polyhedral phosphor particles 65. Thus, in this embodiment, heat of the phosphor particles 60, which is generated in the wavelength converter 50, is sufficiently radiated by the substrate 30, and accordingly, temperature quenching of the phosphor layer 40 is reduced. As a result, in this embodiment, it is possible to increase the output of the light emitting device 1.

Figure 3:
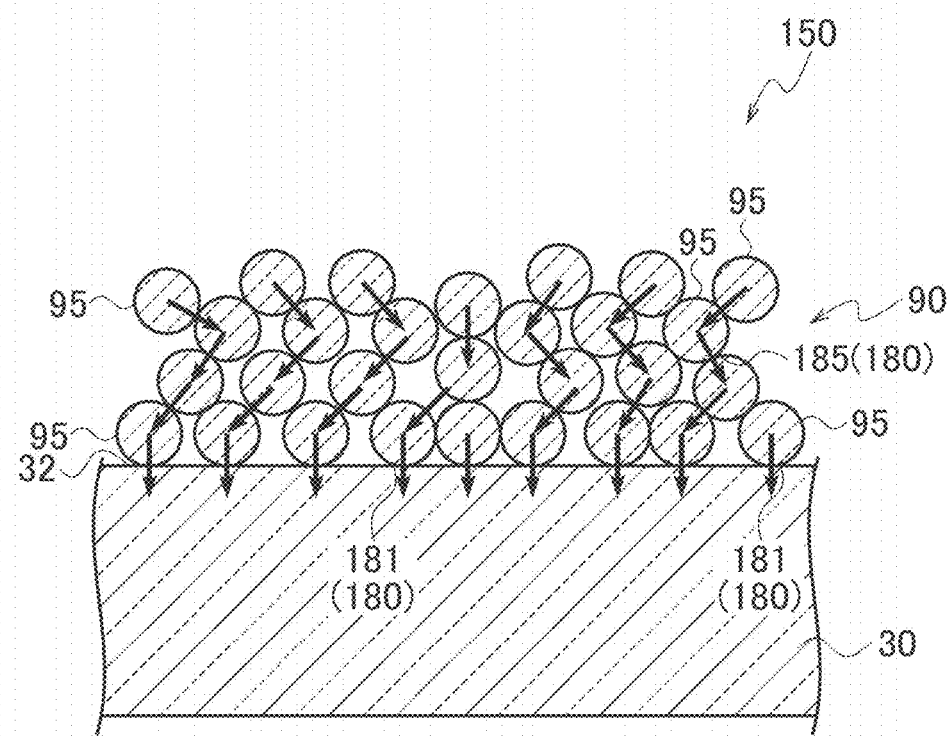
FIG. 3 is a schematic cross-sectional view of a wavelength converter that composes a conventional light emitting device.

FIG. 3 is a schematic cross-sectional view of a wavelength converter that composes a conventional light emitting device. In a conventional wavelength converter 150 shown in FIG. 3, phosphor particles 95 which compose a phosphor layer 90 are grains without the facets 70 having good heat propagation. Therefore, in the conventional wavelength converter 150 shown in FIG. 3, heat propagation between the flat surface 32 of the substrate 30 and the granular phosphor particles 95 which compose the phosphor layer 90 and heat propagation between the adjacent granular phosphor particles 95 are not good. Thus, in the conventional wavelength converter 150, the temperature quenching of the phosphor layer 40 cannot be reduced sufficiently since it is difficult to radiate the generated heat of the phosphor particles 95 by the substrate 30. As a result, by means of the conventional wavelength converter 150, it is difficult to increase the power of the light emitting device.

In the phosphor layer 40 of this embodiment, at least one of a large number of the phosphor particles 60 is the polyhedral phosphor particle 65 that is monodispersed, is derived from the crystal structure of the garnet, and has the facets 70. Here, the facets 70 mean flat crystal planes when viewed on the atomic scale. In general, the facets 70 are found on single crystal particles excellent in crystal quality.

As described above, the polyhedral phosphor particles 65 mean, among the phosphor particles 60, the phosphor particles which exhibit such a polyhedral shape derived from the crystal structure of the garnet and having the facets. Therefore, the polyhedral phosphor particles 65 are a subordinate concept of the phosphor particles 60. FIG. 2 shows a case where all of the phosphor particles 60 are the polyhedral phosphor particles 65. The phosphor particles 60 are prepared so as to have a specific composition and so that a particle size thereof can remain within a specific range, whereby many or substantially all of the obtained phosphor particles 60 can be made as the polyhedral phosphor particles 65. Meanwhile, even if the composition is specific, such phosphor particles 60 with a small particle size may not become the polyhedral phosphor particles 65 in some cases. The composition and particle size of the phosphor particles 60 will be described later.

Moreover, the matter that the polyhedral phosphor particles 65 are monodispersed means that each of the plurality of polyhedral phosphor particles 65 is not a polycrystal but a single crystal that does not have a fracture surface. Note that, if the polyhedral phosphor particles 65 are monodispersed, then the particle size, form, structure and composition thereof are easy to be uniform. Herein, the matter that the particle size is substantially uniform means that a standard deviation of the particle size of the plurality of polyhedral phosphor particles 65 is within 10%.

Moreover, the polyhedral shape derived from the crystal structure of the garnet and having the facets 70 means that the polyhedral phosphor particles 65 have a rhombic dodecahedron shape, or a biased polyhedron shape, or a shape in which edge portions connecting the facets 70 to one another are rounded in each of these shapes. The shape in which the edge portions connecting the adjacent facets 70 to one another are rounded in the rhombic dodecahedron is referred to as a pseudo-rhombic dodecahedron. And the shape in which the edge portions connecting the adjacent facets 70 to one another are rounded in the biased polyhedron is referred to as a pseudo-biased polyhedron. Hereinafter, a shape including the rhombic dodecahedron shape, the biased polyhedron shape, the pseudo-rhombic dodecahedron and the pseudo-biased polyhedron shape is referred to as a "garnet-derived polyhedral shape".

Via the facets 70 which are planar portions of the surfaces of such garnet-derived polyhedral shapes, the polyhedral phosphor particles 65 propagates heat between the phosphor particles 65 and the flat surface 32 of the substrate 30 and between the polyhedral phosphor particles 65 themselves. The polyhedral phosphor particles 65 of this embodiment just need to be capable of propagating heat via the facets 70. Therefore, in addition to the strict rhombic dodecahedron or biased polyhedron, the polyhedral phosphor particles 65 of this embodiment can adopt the garnet-derived polyhedral shape that is a concept including the pseudo-rhombic dodecahedron and the pseudo-biased polyhedron.

Note that the polyhedral phosphor particles 65 to be used in this embodiment do not have fracture surfaces substantially except the case of intentional fracture. Therefore, the polyhedral phosphor particles 65 are high crystal-quality particles with less surface defects. Moreover, the polyhedral phosphor particles 65 to be used in this embodiment have the facets 70 which are clear, and accordingly, are single crystal particles with high crystal quality, in which lattice defects in the particles are less. Therefore, the wavelength converter 50 and the light emitting device 1, which use the polyhedral phosphor particles 65, achieve both of high light emission efficiency and high thermal conductivity.

In the phosphor layer 40 of this embodiment, it is preferable that at least one of the phosphor particles 60 adhered onto the flat surface 32 of the substrate 30 be the polyhedral phosphor particle that is monodispersed, is derived from the crystal structure of the garnet, and has the facets. That is, in the phosphor layer 40 of this embodiment, it is preferable that at least one of the phosphor particles 60 adhered onto the flat surface 32 of the substrate 30 be the polyhedral phosphor particle 65. If such polyhedral phosphor particles 65 are adhered onto the flat surface 32 of the substrate 30, then the heat propagation between the flat surface 32 of the substrate 30 and the polyhedral phosphor particles 65 which compose the phosphor layer 40 is improved. If at least one of such spots where the heat propagation between the phosphor particles 65 and the flat surface 32 of the substrate 30 is good is formed, then the heat propagation between the phosphor layer 40 and the substrate 30 is improved, and a temperature rise of the phosphor particles 60 can be prevented. Note that, preferably, a number of the spots where the heat propagation between the phosphor particles 65 and the flat surface 32 of the substrate 30 is good is larger. In the phosphor layer 40 of this embodiment, which is shown in FIG. 2, a state is shown, where all of the phosphor particles 60 adhered onto the flat surface 32 of the substrate 30 are the polyhedral phosphor particles 65. Therefore, in this embodiment shown in FIG. 2, the heat propagation between the phosphor layer 40 and the substrate 30 is extremely good.

With regard to the phosphor particles 60 to be used in this embodiment, both of the polyhedral phosphor particles 65 and those which are not the polyhedral phosphor particles 65 are garnet compounds including light emission centers which are ions radiating fluorescence. Such a garnet compound has a host crystal represented by a following general formula (1). When a part of elements which compose the host crystal represented by the general formula (1) is replaced by the light emission centers, the phosphor particles 60 having a garnet structure are obtained. Note that those which are not the polyhedral phosphor particles 65 among the phosphor particles 60 do not exhibit the garnet-derived polyhedral shape like the polyhedral phosphor particles 65; however, have the same composition as that of the polyhedral phosphor particles 65. Hereinafter, among the phosphor particles 60, phosphor particles including both of those which are not the polyhedral phosphor particles 65 and the polyhedral phosphor particles 65 will be simply referred to as the phosphor particles 60.

$$\text{General formula: } A'_3B'_2(C'X_4)_3 \quad (1)$$

In the formula (1), A', B' and C' are metallic elements which can compose the garnet structure, and X is a nonmetallic element that can compose the garnet structure.

An example of the metallic element A' in the general formula (1) is at least one element selected from the group consisting of Mg, alkaline metal, alkaline earth metal, a rare earth element and transition metal. In this description, the alkaline earth metal refers to Ca, Sr, Ba and Ra. A specific example of the metallic element A' is at least one element selected from the group consisting of Na, K, Rb, Cs, Mg, Ca, Sr, Ba, Y, Ln. and Mn. Note that Ln refers to lanthanoids with element numbers 57 to 71.

An example of the metallic element B' in the general formula (1) is at least one element selected from the group consisting of Mg, a rare earth element, transition metal, alkaline earth metal and a carbon group element. A specific example of the metallic element B' is at least one element selected from Mg, Sc, Y, Lu, Ti, Zr, Hf, V, Cr, Nb, Fe, Co, Ni, Cu, Zn, Al, Ga, In and Sn.

An example of the metallic element C' in the general formula (1) is at least one element selected from the group consisting of alkaline metal, transition metal, alkaline earth metal, a carbon group element and a nitrogen group element. A specific example of the metallic element C' is at least one element selected from the group consisting of Li, V, Fe, Al, Ga, Si, Ge and P.

An example of the nonmetallic element in the general formula (1) is at least one element selected from the group consisting of nitrogen, chalcogen and halogen. A specific example of the nonmetallic element X is at least one element selected from the group consisting of N, O, F, Cl and the like.

A microscopic structure of the phosphor particles 60 is a structure in which the above light emission center is introduced to the host crystal having the composition represented by the above general formula (1). As the light emission center, for example, at least one ion selected from the group consisting of rare earth ions, transition metal ions and typical metal ions is used. As the rare earth ions, for example, used are $Ce^{3+}$, $Pr^{3+}$, $Nd^{3+}$, $Sm^{3+}$, $Sm^{2+}$, $Eu^{3+}$, $Eu^{2+}$, $Gd^{3+}$, $Tb^{3+}$, $Dy^{3+}$, $Ho^{3+}$, $Er^{3+}$, $Tm^{3+}$, $Yb^{3+}$ and the like. As the transition metal ions, for example, used are $Ti^{4+}$, $Cr^{3+}$, $Mn^{2+}$, $Mn^{4+}$, $Fe^{3+}$, $Cu^{+}$, $Ag^{+}$ and the like. As the typical metal ions, for example, used are $Tl^{+}$, $Sn^{3+}$, $Pb^{2+}$, $Bi^{3+}$, $Sb^{3+}$ and the like.

As the above light emission center, rare earth ions are preferable, which are capable of radiating fluorescence under excitation of light radiated by a solid-state light emitting element. Moreover, if a $Ce^{3+}$-activated phosphor having a structure in which the garnet compound contains at least $Ce^{3+}$ is prepared by using $Ce^{3+}$ among the rare earth ions, then the $Ce^{3+}$-activated phosphor has a function to absorb blue light and convert the blue light into light with a longer wavelength than that of the blue light. Therefore, the $Ce^{3+}$-activated phosphor having the structure in which the garnet compound contains at least $Ce^{3+}$ is preferable for use in the light emitting device.

As the $Ce^{3+}$-activated phosphor that has the host crystal with the garnet structure and is activated by the light emission center $Ce^{3+}$, the host crystal being represented by the general formula (1), for example, used are $Y_3Al_2(AlO_4)_3:Ce^{3+}$; $(Y, Gd)_3Al_2(AlO_4)_3:Ce^{3+}$; $Y_3Ga_2(AlO_4)_3:Ce^{3+}$; $Lu_3Al_2(AlO_4)_3:Ce^{3+}$; $Tb_3Al_2(AlO_4)_3:Ce^{3+}$, $Y_3Al_2(AlO_4)_3:Ce^{3+}$; $Pr^{3+}$; $Y_3Mg_2(AlO_4)(SiO_4)_2:Ce^{3+}$; $Y_3MgAl(AlO_4)_2(SiO_4):Ce^{3+}$; $Lu_2CaMg_2(SiO_4)_3:Ce^{3+}$; $Ca_3Sc_2(SiO_4)_3:Ce^{3+}$; $BaY_2Al_2(AlO_4)_2(SiO_4):Ce^{3+}$; $Ca_2NaMg_2(VO_4)_3:Ce^{3+}$; $Ca_2YZr_2(AlO_4)_3:Ce^{3+}$; $Y_3Al_2(Al(O,F)_4)_3:Ce^{3+}$; $Y_3Al_2(Al(O,N)_4)_3:Ce^{3+}$ and the like. It is relatively easy to produce these garnet phosphors, and accordingly, these garnet phosphors are preferable since the manufacturing cost is decreased.

In the phosphor particles 60, an activation volume of the light emission center to the host crystal represented by the general formula (1) is usually 0.01 atomic % or more and less than 10 atomic % of the total number of atoms of A' in the general formula (1).

Moreover, when it is desired to obtain strong fluorescence in the case where the light emission center is $Ce^{3+}$, it is preferable that the activation volume of the light emission center ($Ce^{3+}$) be set to 0.1 atomic % or more and less than 5 atomic % of the total number of atoms of A' in the general formula (1). Meanwhile, when it is desired to obtain high-efficient fluorescence with small temperature quenching in the case where the light emission center is $Ce^{3+}$, it is preferable that the activation volume of $Ce^{3+}$ be set to 0.01 atomic % or more and less than 1 atomic %, and particularly 0.01 atomic % or more and less than 0.3 atomic % of the total number of atoms of A' in the general formula (1).

Moreover, if the phosphor particles 60 are excited by a laser beam, then this is preferable since it is possible to increase the power of the light emitting device 1.

The phosphor particles 60 to be used in this embodiment have the above composition. Accordingly, the phosphor particles 60 are prepared so that the particle size thereof remains within the specific range of this embodiment, whereby many or substantially all of the obtained phosphor particles 60 can be made as the polyhedral phosphor particles 65. Moreover, the phosphor particles 60 are chemically stable since the phosphor particles 60 are the garnet phosphors, and accordingly, a light emitting device excellent in reliability is obtained.

The polyhedral phosphor particles 65 are configured so that an area of at least one facet 70 preferably exceeds 200 $\mu m^2$, more preferably exceeds 250 $\mu m^2$. Moreover, the polyhedral phosphor particles 65 are configured so that the area of the facets 70 of at least one thereof still more preferably exceeds 300 $\mu m^2$, particularly preferably exceeds 400 $\mu m^2$. If the area of at least one facet 70 of the polyhedral phosphor particles 65 exceeds 200 $\mu m^2$, then this is preferable since the heat propagation between the phosphor layer 40 and the substrate 30 is good.

If the polyhedral phosphor particles 65 in which the area of at least one facet 70 exceeds 200 $\mu m^2$ is adhered onto the flat surface 32 of the substrate 30, then this is preferable since the heat propagation between the phosphor layer 40 and the substrate 30 is good. If plural pieces of the polyhedral phosphor particles 65 in which the area of at least one facet 70 exceeds 200 $\mu m^2$ are adhered onto the flat surface 32 of the substrate 30, then this is preferable since the heat propagation between the phosphor layer 40 and the substrate 30 is better.

Moreover, in the polyhedral phosphor particles 65 adhered onto the flat surface 32 of the substrate 30, it is desirable that the facets 70 in which the area exceeds 200 $\mu m^2$ be adhered to the flat surface 32 of the substrate 30 via the substrate-phosphor adhesion portions 81. In this case, the heat propagation from the phosphor layer 40 to the substrate 30 is improved more. The area of the facets 70 of the polyhedral phosphor particles 65 adhered to the flat surface 32 of the substrate 30 via the substrate-phosphor adhesion portions 81 is set so as to more preferably exceed 250 $\mu m^2$, still more preferably exceed 300 $\mu m^2$, particularly preferably 400 $\mu m^2$.

If the plural pieces of the polyhedral phosphor particles 65 in which the facets 70 with the area exceeding 200 $\mu m^2$ are adhered to the flat surface 32 via the substrate-phosphor adhesion portions 81 are adhered onto the flat surface 32 of the substrate 30, then this is preferable since the heat propagation between the phosphor layer 40 and the substrate 30 is good.

If the facets 70 of the polyhedral phosphor particles 65 and the flat surface 32 of the substrate 30 are adhered to each other in a surface contact manner, then this is preferable since the heat propagation from the phosphor layer 40 to the substrate 30 is better. Here, the matter that the facets 70 of the polyhedral phosphor particles 65 and the flat surface 32 of the substrate 30 are adhered to each other in a surface contact manner means that the facets 70 of the polyhedral phosphor particles 65 and the flat surface 32 of the substrate 30 are adhered to each other while facing each other in a parallel or substantially parallel state. This parallel or substantially parallel state means that an angle made by the facets 70 of the polyhedral phosphor particles 65 and the flat surface 32 of the substrate 30 remains within a range of −10° to +10°.

In usual, the facets 70 of the polyhedral phosphor particles 65 and the flat surface 32 of the substrate 30 are adhered to each other via the adhesion portions 80 (substrate-phosphor adhesion portions 81) made of a binding agent. If thicknesses of the substrate-phosphor adhesion portions 81 vary depending on spots, then the facets 70 of the polyhedral phosphor particles 65 and the flat surface 32 of the substrate 30 do not become parallel to each other. In this embodiment, if the facets 70 of the polyhedral phosphor particles 65 and the flat surface 32 of the substrate 30 are adhered to each other in a surface contact manner, then this is preferable since heat propagates well between the facets 70 of the polyhedral phosphor particles 65 and the flat surface 32 of the substrate 30. Moreover, if there are provided such plural portions where the facets 70 of the polyhedral phosphor particles 65 and the flat surface 32 of the substrate 30 are adhered to each other in a surface contact manner, then this is preferable since the heat propagation between the phosphor layer 40 and the substrate 30 is good.

The polyhedral phosphor particles 65 have a median particle size $D_{50}$ of 30 $\mu m$ or more and the maximum thickness of the phosphor layer 40 or less, and are larger than generally used phosphor particles. Here, the maximum thickness of the phosphor layer 40 is a maximum value of a thickness of an adhesion body formed of the phosphor particles 60 and the adhesion portions 80 contained according to needs. The maximum thickness of the phosphor layer 40 is denoted by t in FIG. 2. Note that the polyhedral phosphor particles 65 are a subordinate concept of the phosphor particles 60, and accordingly, the polyhedral phosphor particles 65 may be used for specifying the maximum thickness of the phosphor layer 40 in some cases. If the median particle size $D_{50}$ of the polyhedral phosphor particles 65 remains within the above range, then this is preferable since highly flat facet surfaces are likely to be clearly formed on the polyhedral phosphor particles 65.

The median particle size $D_{50}$ of the polyhedral phosphor particles 65 is preferably 40 µm or more, more preferably 50 µm or more, still more preferably 65 µm or more, yet more preferably 75 µm or more, particularly preferably 100 µm or more. If the median particle size $D_{50}$ of the polyhedral phosphor particles 65 is the above values or more, then this is preferable since it is easy to clearly form the highly flat facets on the polyhedral phosphor particles 65.

Note that monodispersed particles having the crystal structure of the garnet have been heretofore known. However, in the conventional monodispersed particles having the crystal structure of the garnet, in general, a median particle size $D_{50}$ thereof has been less than 30 µm. Moreover, the conventional monodispersed particles having the crystal structure of the garnet have a particle shape similar to a polyhedron intrinsic to the garnet structure; however, have had a shape similar to a spherical shape rather than to the polyhedron, in which edge portions of the polyhedron are rounded. Therefore, in the conventional monodispersed particles having the crystal structure of the garnet, an area of the facets has been small, and has been less than 200 µm$^2$ at most.

The median particle size $D_{50}$ of the polyhedral phosphor particles 65 is preferably less than 2 mm, more preferably less than 500 µm, still more preferably less than 200 µm, yet more preferably less than 100 µm, particularly preferably less than 50 µm. If the median particle size $D_{50}$ of the polyhedral phosphor particles 65 is less than the above values, then this is preferable since it is easy to clearly form the highly flat facets on the polyhedral phosphor particles 65.

In the phosphor layer 40, if the facets 70 of the adjacent polyhedral phosphor particles 65 are adhered to one another in a surface contact manner, then this is preferable since heat propagation in the phosphor layer 40 is better. Here, the matter that the facets 70 of the adjacent polyhedral phosphor particles 65 are adhered to one another in a surface contact manner means that the facets 70 of the adjacent polyhedral phosphor particles 65 are adhered to one another while facing one another in a parallel or substantially parallel state. This parallel or substantially parallel state means that an angle made mutually by the adhered facets 70 of the adjacent polyhedral phosphor particles 65 remains within a range of −10° to +10°.

In the phosphor layer 40, the facets 70 of the adjacent polyhedral phosphor particles 65 are usually adhered to one another via the adhesion portions 80 (inter-phosphor particle adhesion portions 85) made of a binding agent. However, if thicknesses of the inter-phosphor particle adhesion portions 85 differ depending on spots of the phosphor layer 40, then the facets 70 of the adjacent polyhedral phosphor particles 65 are prone not to become parallel to one another due to a difference in thickness between the inter-phosphor particle adhesion portions 85. If the facets 70 of the phosphor particles 65 do not become parallel to one another as above, then the heat propagation between the adjacent polyhedral phosphor particles 65 is prone to be degraded.

In contrast, if the facets 70 of the adjacent polyhedral phosphor particles 65 are adhered to one another in a surface contact manner by the inter-phosphor particle adhesion portions 85, then this is preferable since heat propagates well between the facets 70 of the adjacent polyhedral phosphor particles 65. Moreover, if there are provided such plural portions where the facets 70 of the adjacent polyhedral phosphor particles 65 are adhered to one another in a surface contact manner, then this is preferable since the heat propagation in the phosphor layer 40 is good.

It is preferable that the substrate-phosphor adhesion portions 81 which adhere the facets 70 of the polyhedral phosphor particles 65 and the flat surface 32 of the substrate 30 be made of an inorganic binding agent. If the substrate-phosphor adhesion portions 81 are made of an inorganic binding agent, then this is preferable since heat dissipation of the wavelength converter 50 is increased because heat dissipation paths between the phosphor layer 40 and the substrate 30 can be formed of an inorganic material having relatively good thermal conductivity.

As the inorganic binding agent to be used for the substrate-phosphor adhesion portions 81, for example, a low melting point substance having a melting point of 400° C. or lower and nanoparticles are used. As the low melting point substance with a melting point of 400° C. or lower, for example, low melting point glass, low melting point oxide, low melting point halide and the like are used.

If the inorganic binding agent is nanoparticles in which a median particle size $D_{50}$ is 1 nm or more and 100 nm or less, then this is preferable since strong adhesion portions are formed because the nanoparticles have a large specific surface area and high reactivity.

As the nanoparticles, for example, used are nanoparticles made of at least one inorganic oxide selected from the group consisting of $Al_2O_3$, $ZnO$, $MoO_3$ and $ZnMoO_4$. These nanoparticles are preferable since the nanoparticles are excellent in thermal conductivity and it is easy to form a low melting point compound thereby.

It is preferable that the inter-phosphor particle adhesion portions 85 which adhere the facets 70 of the adjacent polyhedral phosphor particles 65 be made of an inorganic binding agent. If the inter-phosphor particle adhesion portions 85 are made of an inorganic binding agent, then this is preferable since the heat dissipation of the wavelength converter 50 is increased because heat dissipation paths in the phosphor layer 40 can be formed of an inorganic material having relatively good thermal conductivity. As the inorganic binding agent, the same one as the inorganic binding agent to be used for forming the substrate-phosphor adhesion portions 81 is used.

As above, the phosphor layer 40 contains, as an essential component, the polyhedral phosphor particles 65 which are the phosphor particles 60. Depending on the case, the phosphor layer 40 contains those which are not the polyhedral phosphor particles 65 among the phosphor particles 60 and contains the adhesion portions 80. In addition to these components, the phosphor layer 40 may further contain small particles smaller in particle size than the phosphor particles 60. Note that the matter that the small particles are smaller in particle size than the phosphor particles 60 means that the small particles are smaller in particle size than the phosphor particles 65, and that the small particles are smaller in particle size than those which are not the polyhedral phosphor particles 65 among the phosphor particles 60.

If the small particles are contained in the phosphor layer 40, then the small particles are filled in gaps formed in such a manner that the polyhedral phosphor particles 65, those which are not the polyhedral phosphor particles 65 among the phosphor particles 60 and the flat surface 32 of the substrate 30 are adhered to one another, and the phosphor layer 40 forms a dense structure. Therefore, the phosphor layer 40 enhances mechanical strength thereof and increases thermal conductivity thereof. A material of the small particles is not particularly limited; however, an inorganic material is preferable since the thermal conductivity of the phosphor layer 40 is increased.

When the small particles are the inorganic material, a phosphor made of the inorganic material or an inorganic substance other than the phosphor is used as the small particles. When the small particles are the phosphor, the phosphor layer 40 is filled with the small particles made of the phosphor in addition to the phosphor particles 60, and accordingly, forms a film structure filled with the phosphor in high density. Therefore, if the small particles filled into the phosphor layer 40 are the phosphor, then such a wavelength converter 50 is obtained, which has large light absorption power for excitation light and radiates fluorescence with large fluorescence intensity.

Meanwhile, for example, when the small particles are a translucent substance other than the phosphor, then the phosphor layer 40 becomes excellent in optical transparency. Therefore, if the small particles to be filled into the phosphor layer 40 are the translucent substance, then such a wavelength converter 50 is obtained, which easily allows permeation of the fluorescence radiated by the phosphor and of the excitation light.

Moreover, for example, when the small particles are a light reflecting substance other than the phosphor, then the phosphor layer 40 becomes excellent in light reflectivity for the excitation light. Therefore, if the small particles to be filled into the phosphor layer 40 are the light reflecting substance, then such a wavelength converter 50 is obtained, which easily controls light reflection of the excitation light.

Note that, when the small particles are the phosphor, the small particles may be the same phosphor as the phosphor particles 60 or may be a different phosphor therefrom in terms of luminescent color and composition. Moreover, when the small particles are the same phosphor as the phosphor particles 60, the small particles may have a similar shape to that of the polyhedral phosphor particles 65. Note that, even if the small particles are the same phosphor as the phosphor particles 60 and have a similar shape to that of the polyhedral phosphor particles 65, the small particles can be distinguished from the phosphor particles 60 and the polyhedral phosphor particles 65 on the basis of particle sizes.

If the small particles are obtained by reducing the particle sizes of the phosphor particles 60 and the polyhedral phosphor particles 65, then such a wavelength converter 50 for which intense light emission intensity can be expected is obtained without changing a color tone of the phosphor. Meanwhile, if the small particles are the phosphor different from the polyhedral phosphor particles 65, then such a wavelength converter 50 that radiates fluorescence controlled in color tone is obtained. Moreover, if the small particles are the phosphor having the crystal structure of the garnet, then such a wavelength converter 50 having good light absorption characteristics for the excitation light is obtained. Furthermore, if the small particles are the phosphor that does not have the crystal structure of the garnet, then such a wavelength converter 50 that easily reflects the excitation light to some extent is obtained. When the small particles are the phosphor of the monodispersed particles having the facets, then the heat dissipation paths are easy to expand.

(Functions)

A description will be given of functions of the light emitting device 1.

First, as shown in FIG. 1, the primary light (for example, laser beam) L radiated from the solid-state light emitting element 10 of the light emitting device 1 is condensed to the wavelength converter 50 via the lens 20. When the substrate 30 is a metal substrate, the primary light L radiated to the wavelength converter 50 permeates the phosphor layer 40 and is reflected on the substrate 30. Note that, when the substrate 30 of the wavelength converter 50 is a transparent substrate, the primary light L radiated to the wavelength converter 50 permeates the substrate 30 and the phosphor layer 40 in this order. In the wavelength converter 50, at the time when the primary light L permeates the phosphor layer 40, the phosphor particles 60 contained in the phosphor layer 40 radiate the fluorescence F. By this fluorescence F, the light emitting device 1 radiates, as output light, light including the primary light L and the fluorescence F.

The phosphor particles 60 in the phosphor layer 40 generate heat while radiating the fluorescence F. As shown by arrows shown in FIG. 2, the heat generated in the phosphor particles 60 (polyhedral phosphor particles 65) propagates between the adjacent polyhedral phosphor particles 65, and propagates toward the flat surface 32 of the substrate 30 from the polyhedral phosphor particles 65 on the flat surface 32 of the substrate 30. As shown in FIG. 2, in the wavelength converter 50, the facets 70 are formed on the polyhedral phosphor particles 65. Moreover, in the wavelength converter 50, the adjacent polyhedral phosphor particles 65 are adhered to one another via the facets 70 in a surface contact manner, and the flat surface 32 of the substrate 30 and the polyhedral phosphor particles 65 are adhered to each other via the facets 70 in a surface contact manner. Note that the adjacent polyhedral phosphor particles 65 are adhered to one another via the inter-phosphor particle adhesion portions 85. The flat surface 32 of the substrate 30 and the polyhedral phosphor particles 65 are adhered to each other via the substrate-phosphor adhesion portions 81.

Due to such a configuration, the heat generated in the phosphor particles 60 propagates between the adjacent polyhedral phosphor particles 65 via the facets 70 brought into surface contact with each other, and propagates via the facets 70 toward the flat surface 32 of the substrate 30 from the polyhedral phosphor particles 65 on the flat surface 32 of the substrate 30. As above, in the wavelength converter 50, heat is transferred via the facets 70 of the polyhedral phosphor particles 65 which are planar and have large heat transfer surfaces. Accordingly, the heat of the phosphor layer 40 propagates rapidly to the substrate 30, and can prevent the temperature rise and temperature quenching of the phosphor layer 40. Therefore, the light emitting device 1 including this wavelength converter 50 can enhance the light emission output by increasing the solid-state light emitting element 10, and so on.

For functional comparison, a description will be given of functions of a light emitting device including the conventional wavelength converter 150 with reference to FIG. 3. In a similar way to the light emitting device 1, when the primary light (for example, laser beam) radiated from the solid-state light emitting element is condensed to the wavelength converter 150 via the lens, then in the wavelength converter 150, the phosphor particles 95 contained in the phosphor layer 90 radiates fluorescence at the time when the primary light L permeates the phosphor layer 90. By this fluorescence, the light emitting device radiates, as output light, light including the primary light and the fluorescence.

The spherical phosphor particles 95 in the phosphor layer 90 generate heat while radiating the fluorescence. As shown by arrows shown in FIG. 3, the heat generated in the phosphor particles 95 propagates between the adjacent phosphor particles 95, and propagates toward the flat surface 32 of the substrate 30 from the phosphor particles 95 on the flat surface 32 of the substrate 30. As shown in FIG. 3, in the wavelength converter 150, the facets 70 are not formed on the phosphor particles 95. In the wavelength converter 150, the adjacent phosphor particles 95 are adhered to one another via the adhesion portions 180, and the flat surface 32 of the substrate 30 and the phosphor particles 95 are adhered to each other via the adhesion portions 180. Specifically, the adjacent phosphor particles 95 are adhered to one another via inter-phosphor particle adhesion portions 185 as the adhesion portions 180. The flat surface 32 of the substrate 30 and the phosphor particles 95 are adhered to each other via the substrate-phosphor adhesion portions 181 as the adhesion portions 180. Therefore, the heat generated in the phosphor particles 95 propagates between the adjacent phosphor particles 95 via curved surfaces of the phosphor particles 95, and propagates via the curved surfaces toward the flat surface 32 of the substrate 30 from the phosphor particles 95 on the flat surface 32 of the substrate 30.

As above, in the wavelength converter 150, the heat is transferred via the surfaces of the phosphor particles 95 which are curved and small heat transfer surfaces. Accordingly, the heat of the phosphor layer 90 is difficult to propagate rapidly to the substrate 30, and temperature rise of the phosphor layer 90 is prone to occur, and it is difficult to prevent the temperature quenching. Since it is difficult to prevent the temperature quenching as above, it is difficult for the conventional light emitting device including this wavelength converter 150 to enhance the light emission output.

In the light emitting device of this embodiment, at least a part of the phosphor particles 60 which compose the phosphor layer 40 is the polyhedral phosphor particles 65 which are derived from the crystal structure of the garnet and have the facets 70. Therefore, the light emitting device of this embodiment achieves high power by preventing the temperature rise of the phosphor under the high light density excitation generated by laser beam irradiation. Therefore, the light emitting device of this embodiment is suitable as a laser lighting device or a laser projector.

EXAMPLES

Hereinafter, a more detailed description will be given by using examples.

[Example 1]<Formation of Phosphor Film by $Al_2O_3$>

(Preparation of Mixed Solution)

First, prepared were YAG phosphor powder (YAG phosphor powder A) with a median particle size $D_{50}$ of 29 μm and YAG phosphor powder (YAG phosphor powder B) with a median particle size $D_{50}$ of 44 μm. Note that these YAG phosphor powders were synthesized by an orthodox solid phase reaction. Phosphor particles of the YAG phosphor powder A did not have facets. Phosphor particles of the YAG phosphor powder B had facets.

Moreover, as nanoparticles, nanoparticles (average particle size: 20 nm) of aluminum oxide ($Al_2O_3$) were prepared.

Next, these nanoparticles were dispersed in water, and an aqueous suspension ($Al_2O_3$ nanoparticle aqueous slurry) with a solid content of 30% by mass was prepared.

Thereafter, in water, 0.7 g of the YAG phosphor powder A, 1.4 g of the YAG phosphor powder B and 0.9 g of the $Al_2O_3$ nanoparticle aqueous slurry were mixed and adjusted with one another, and a mixed solution (mixed solution M1) was obtained. A median particle size $D_{50}$ of all of the YAG phosphor powders in the mixed solution M1 was 33 μm.

(Fabrication of Inorganic Wavelength Converter)

A Kapton tape was pasted onto a metal substrate with a size of 20 mm in length×20 mm in width and a thickness of 0.5 mm, the metal substrate being made of an aluminum alloy, whereby low walls were formed. Then, an appropriate amount of the mixed solution M1 was dropped onto a portion surrounded by the low walls, and the mixed solution M1 was applied to a predetermined area on the metal substrate by an applicator using bar coating.

The applied mixed solution M1 was dried by being heated at 100° C. for 1 hour using a hot plate, and moisture in the mixed solution M1 was evaporated. In this way, obtained was an inorganic wavelength converter composed in such a manner that a thick phosphor layer composed of the YAG phosphors and the nanoparticles of $Al_2O_3$, which adhered the YAG phosphors to each other, was formed on the metal substrate.

Figure 5:
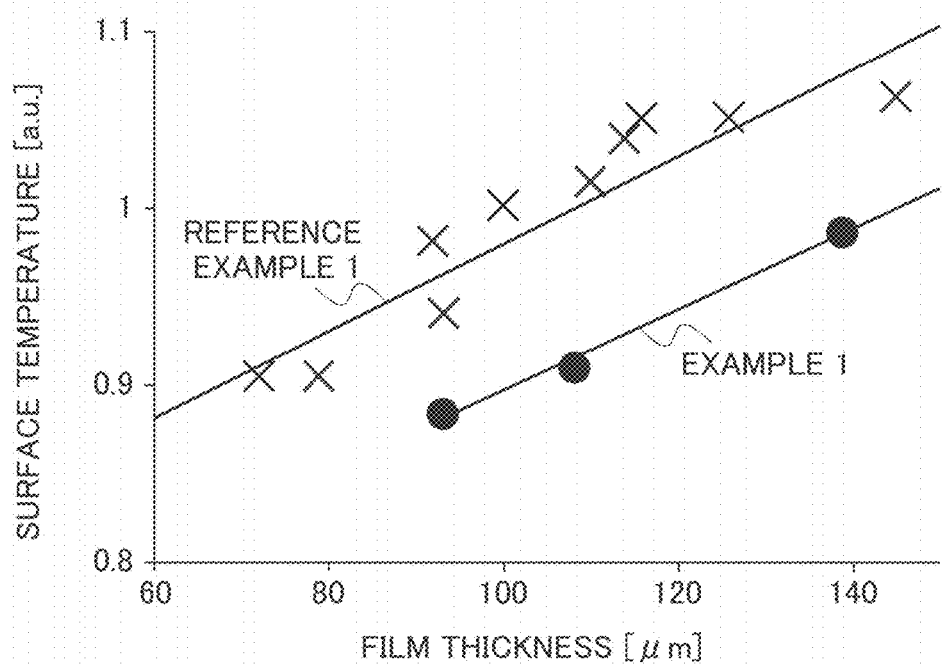
FIG. 5 is a graph showing relationships between film thicknesses and surface temperatures of light emitting devices according to Example 1 and Reference example 1.

Three types of the inorganic wavelength converters were fabricated so that thicknesses of the thick phosphor layers thereof differed from one another. When the thicknesses of the phosphor layers on the metal substrates were measured by the stylus profiling system DEKTAK (Bruker), the thicknesses of three types of such sample phosphor layers were 92 to 140 μm. Results are shown in FIG. 5. Each of the phosphor layers contained at least one phosphor particle having a facet with an area of about 450 μm².

(Evaluation)

<Test of Irradiating Inorganic Wavelength Converter with Laser Beam>

The metal substrate of each of the inorganic wavelength converters was fixed to a metal-made heat sink so as to be brought into close contact therewith, and thereafter, a surface of the phosphor layer was irradiated with a laser beam (center wavelength λ: 450 nm, 4.5 w/mm²).

A surface temperature of the phosphor layer when irradiated was measured using an infrared thermography (Neo Thermo (registered trademark) TVS-700: made by Nippon Avionics Co., Ltd.) Meanwhile, a light emission spectrum and illumination intensity of the phosphor layer were measured using a spectrophotometer (MCPD-3000: made by Otsuka Electronics Co., Ltd.) and an illuminometer T-10 (made by Konica Minolta Inc.). Moreover, conversion efficiency of the phosphor layer from blue light to yellow light was calculated using measurement data of the light emission spectrum and the illumination intensity. Note that an incident angle of the laser beam to the phosphor layer was set to 45°, and an application time of the laser beam was set to 60 seconds.

With regard to three types of the inorganic wavelength converters in Example 1, which were different in thickness from one another, relationships between film thicknesses (μm) of the phosphor layers and surface temperatures (a.u.) of the phosphor layers were measured. Each of the surface temperatures (a.u.) is a highest temperature in a temperature distribution of the surface of the phosphor layer, which was obtained by adjusting a camera of the infrared thermography so that the camera was focused on the surface of the phosphor layer. Results are shown in FIG. 5. In FIG. 5, data of three types of the inorganic wavelength converters in which the film thicknesses of the phosphor layers were different from one another were plotted, and a linear approximation was performed based on the data of these three points to create a line graph. Note that the surface temperatures [a.u.] shown in FIG. 5 are values normalized while taking an actually measured value of a surface temperature $T_S$ (K) of a sample (reference symbol x) with a film thickness of 100 μm in Reference example 1 to be described later as 1.

<Microscopy>

Figure 4:
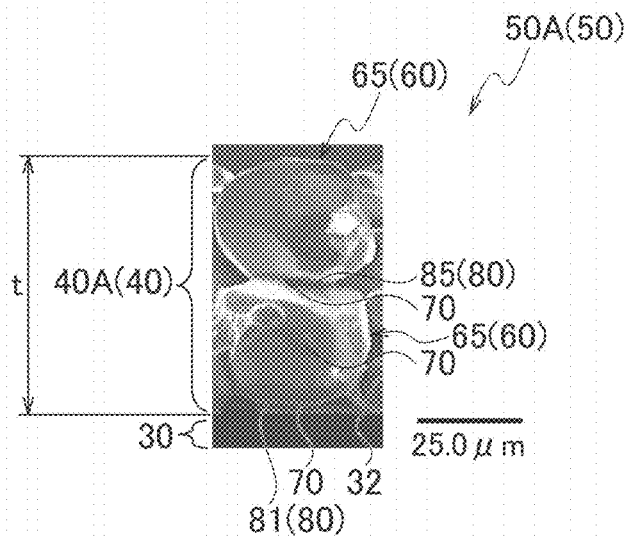
FIG. 4 is an example of a SEM picture of a fracture surface fractured along a thickness direction of a wavelength converter that composes a light emitting device according to Example 1.

A fracture surface obtained by fracturing the inorganic wavelength converter along a thickness direction thereof was observed by a scanning electron microscope (SEM). FIG. 4 is an example of a SEM picture of a fracture surface of the wavelength converter that composes the light emitting device according to Example 1.

As seen from FIG. 4, it was found that the inorganic wavelength converter 50A (50) in Example 1 includes: the metal substrate 30; and a phosphor layer 40A (40) composed in such a manner that a large number of the phosphor particles 60 were adhered onto the flat surface 32 of the metal substrate 30. Moreover, it was found that, in the inorganic wavelength converter 50A, the facets 70 of the phosphor particles 65 (60) and the flat surface 32 of the metal substrate 30 were in surface contact with each other via the adhesion portions 80 (substrate-phosphor adhesion portions 81) composed in such a manner that the nanoparticles of aluminum oxide were adhered to one another. Furthermore, as seen from FIG. 4, it was found that, in the inorganic wavelength converter 50A in Example 1, the facets 70 of the adjacent phosphor particles 65 were in surface contact with one another via the adhesion portions 80 (inter-phosphor particle adhesion portions 85) composed in such a manner that the nanoparticles of aluminum oxide were adhered to one another.

As seen from FIG. 4, it was found that, in the inorganic wavelength converter 50A in Example 1, thick heat dissipation paths generated by the surface contact were formed between the phosphor particles 65 and the metal substrate 30 and between the adjacent phosphor particles 65. It is considered easy to lower the temperature of the inorganic wavelength converter 50A in Example 1 since the inorganic wavelength converter 50A becomes a highly thermal conductive inorganic wavelength converter by the thick heat dissipation paths due to the surface contact and it becomes easy to dissipate the heat, which is generated in the phosphor layer, to the metal substrate and the heat sink.

Reference Example 1

(Preparation of Mixed Solution)

First, a mixed solution (mixed solution M2) was obtained in a similar way to Example 1 except for using the YAG phosphor powder B. Note that YAG phosphor powder in the mixed solution M2 under preparation was only the YAG phosphor powder A, and a median particle size $D_{50}$ thereof was 29 μm.

(Fabrication of Inorganic Wavelength Converter)

Next, in a similar way to Example 1 except for using the mixed solution M2 in place of the mixed solution M1, an inorganic wavelength converter was obtained, which was composed in such a manner that a thick phosphor layer composed of the YAG phosphor and the nanoparticles was formed on the metal substrate.

Ten types of the inorganic wavelength converters were fabricated so that thicknesses of the thick phosphor layers thereof differed from one another. The thicknesses of ten types of the phosphor layers were 72 to 145 μm. The thicknesses of the phosphor layers on such metal substrates were measured in a similar way to Example 1. Results are shown in FIG. 5. In FIG. 5, in a similar way to Example 1, data of ten types of the inorganic wavelength converters in which the film thicknesses of the phosphor layers were different from one another were plotted, and a linear approximation was performed based on the data of these ten points to create a line graph. The surface temperatures [a.u.] shown in FIG. 5 are values normalized while taking, as 1, the actually measured value of the surface temperature $T_S$(K) of the sample (reference symbol x) with a film thickness of 100 μm in Reference example 1. Note that any of ten types of the phosphor layers in Reference example 1 did not contain the phosphor particles having the facets.

(Comparison Between Example 1 and Reference Example 1)

From the results of Example 1 and Reference example 1, a phosphor temperature reduction rate and an improvement rate of blue→yellow conversion efficiency in the inorganic wavelength converter of Example 1 were obtained.

[Phosphor Temperature Reduction Rate]

First, a temperature $T_{EX}$ at a film thickness X μm on the line graph of Example 1 and a temperature $T_{RX}$ at a film thickness X μm on the line graph of Reference example 1 were obtained. Next, these were assigned to $\{1-(T_{EX}/T_{RX})\} \times 100$ to calculate the phosphor temperature reduction rate (%). For example, in FIG. 5, at a film thickness of 100 μm, $T_{E100}$ is 0.895, and $T_{R100}$ is 0.980. Accordingly, the phosphor temperature reduction rate was calculated to be about 10% by $\{1-(0.895/0.980)\} \times 100$. Results are shown in Table 1.

[Improvement Rate of Conversion Efficiency from Blue Light to Yellow Light]

For each of the inorganic wavelength converters in Example 1 and Reference example 1, the conversion efficiency (%) from blue light to yellow light was measured. The conversion efficiency (%) from the blue light to the yellow light was measured as follows. First, from a yellow region spectrum obtained by the spectrophotometer and values of the illuminometer, an energy amount of the yellow region was calculated, and this energy amount was divided by an input light energy amount of the blue region. Next, an average difference $\Delta CE_a$ (%) obtained by subtracting the above conversion efficiency $CE_0$ (%) of the inorganic wavelength converter in Reference example 1 from the above conversion efficiency $CE_1$(%) of the inorganic wavelength converter in Example 1 was defined as the improvement rate (%) of the conversion efficiency from the blue light to the yellow light. Results are shown in Table 1.

TABLE 1

|  | Phosphor Temperature Reduction Rate (%) | Improvement Rate of Conversion Efficiency from Blue light to Yellow light (%) |
| --- | --- | --- |
| Example 1 | 10 | 2 |
| Reference example 1 | 0 | 0 |

As shown in Table 1, the conversion efficiency from the blue light to the yellow light in the inorganic wavelength converter of Example 1 was higher by 2% than the conversion efficiency from the blue light to the yellow light in the inorganic wavelength converter of Reference example 1. That is, the improvement rate of the conversion efficiency from the blue light to the yellow light in the inorganic wavelength converter of Example 1 was 2%.

Note that a reason why the conversion efficiency from the blue light to the yellow light is improved is considered to be that, since the surface temperature of the inorganic wavelength converter is lowered, the temperature of the phosphor can be lowered to prevent the temperature quenching of the phosphor.

[Example 2]<Formation of Phosphor Film by ZnO—$MoO_3$>

(Preparation of Mixed Solution)

Figure 6:
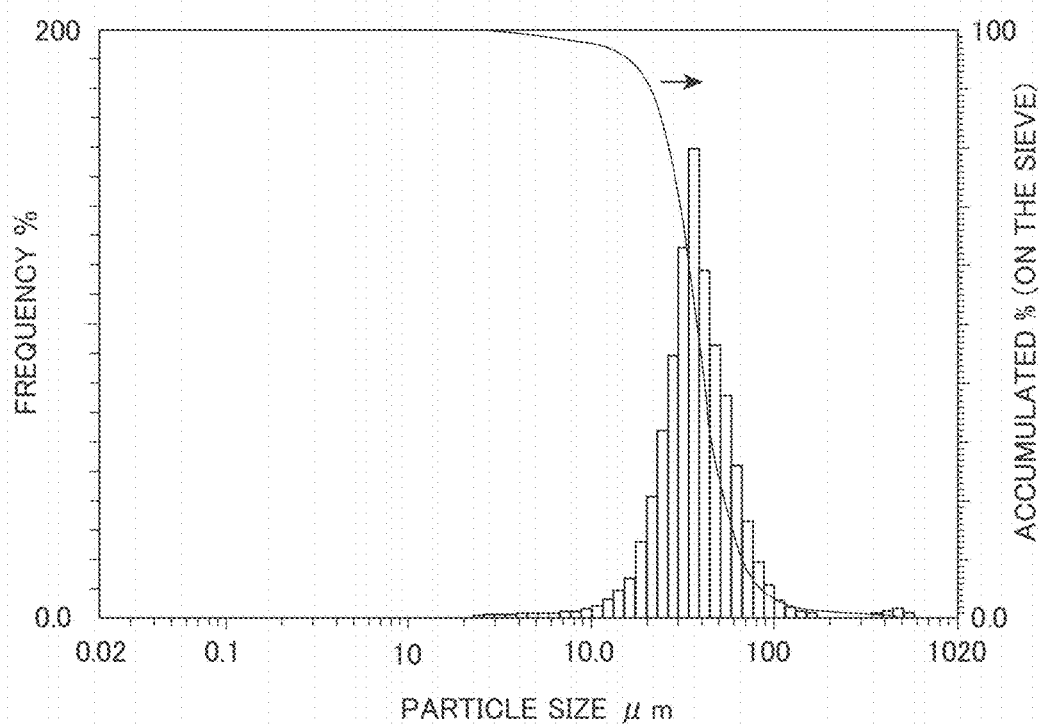
FIG. 6 is a graph showing a particle size distribution of YAG phosphor powder C to be used for a light emitting device according to Example 2.

First, as phosphor particles, YAG powder (YAG phosphor powder C) with a median particle size $D_{50}$ of 37 μm was prepared. FIG. 6 shows a particle size distribution of the YAG phosphor powder C. Moreover, as nanoparticles, $MoO_3$ nanoparticle with an average particle size of 500 nm were prepared. Furthermore, as nanoparticles, nanoparticles of zinc oxide (ZnO) with an average particle size of 100 nm were prepared. Next, these nanoparticles were dispersed in 2-propanol, and a suspension (ZnO nanoparticle suspension) with a solid content of 10% by mass was prepared.

To 0.4 g of the ZnO nanoparticle suspension, 0.21 g of the $MoO_3$ nanoparticles were added and stirred, whereby a nanoparticle dispersion liquid was prepared. Next, to 1.5 g of the YAG phosphor powder C put into a beaker, 0.65 g of the nanoparticle dispersion liquid was added and stirred, whereby a mixed solution (mixed solution M3) was prepared.

(Fabrication of Inorganic Wavelength Converter)

Aluminum alloy-made metal substrates with a size of 20 mm in length×20 mm in width and a thickness of 0.5 mm were arrayed continuously, and a Kapton tape was pasted onto a surface of each of the metal substrates, whereby low walls were formed. Then, the mixed solution M3 was dropped onto a portion surrounded by the low walls, and the mixed solution M3 was applied to a predetermined area on the metal substrate by bar coating using an applicator.

The 2-propanol was evaporated by heating the applied mixed solution M3 at 100° C. for 1 hour using a hot plate, whereby a dried body of the mixed solution M3 was obtained. Moreover, this dried body was sintered by being heated at 450° C. for 2 hours using the hot plate.

In this way, obtained was an inorganic wavelength converter composed in such a manner that a thick phosphor layer composed of the YAG phosphor, the nanoparticles of ZnO and the nanoparticles of $MoO_3$ was formed on the metal substrate.

Three types of the inorganic wavelength converters were fabricated so that thicknesses of the thick phosphor layers thereof differed from one another. When the thicknesses of the phosphor layers on the metal substrates were measured by the stylus profiling system DEKTAK (Bruker), the thicknesses of three types of such sample phosphor layers were 92 to 140 μm.

<Microscopy>

[Observation of Surface of Phosphor Layer]

Figure 7:
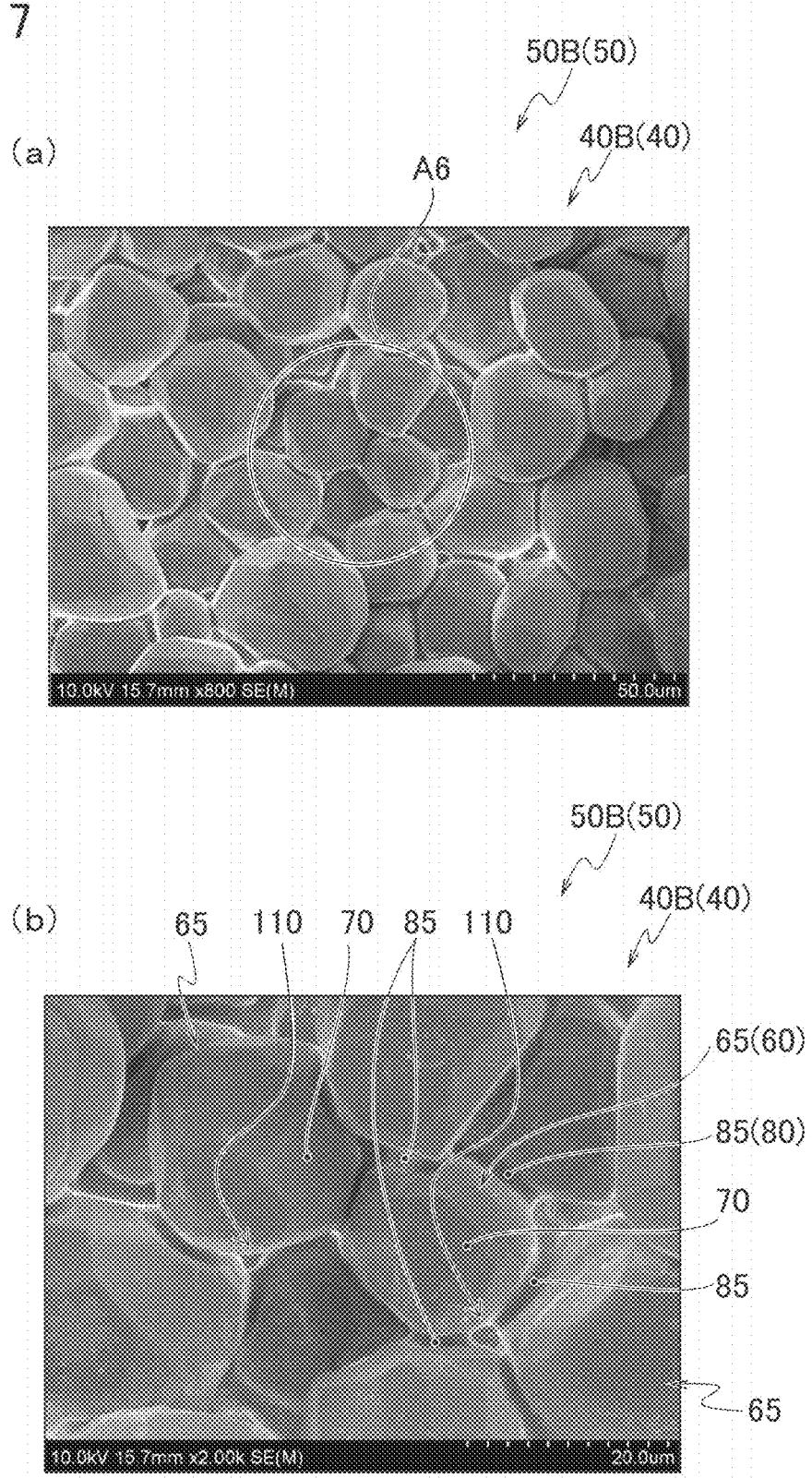
FIG. 7 is examples of SEM pictures of a surface of a phosphor layer of the wavelength converter that composes the light emitting device according to Example 2.

A surface of each of the inorganic wavelength converters was observed by a scanning electron microscope (SEM). FIG. 7 and FIG. 8 are examples of SEM pictures of the surface of the phosphor layer of the wavelength converter that composes the light emitting device according to Example 2. Specifically, FIG. 7(a) is an example of a SEM picture (800 times magnification) of the surface of the phosphor layer 40B (40) of the wavelength converter 50B (50) that composes the light emitting device according to Example 2. FIG. 7(b) is an example of a SEM picture (2000 times magnification) obtained by enlarging a region A6 of FIG. 7(a).

FIG. 8(a) is another example of a SEM picture (4000 times magnification) obtained by further enlarging the surface of the phosphor layer 40B (40) of the wavelength converter 50B (50) that composes the light emitting device according to Example 2. FIG. 8(b) is another example of a SEM picture (7000 times magnification) obtained by still further enlarging the surface of the phosphor layer 40B (40) of the wavelength converter 50B (50) that composes the light emitting device according to Example 2.

As seen from FIGS. 7 and 8, it was found that, in the inorganic wavelength converter 50B in Example 2, the facets 70 of the adjacent phosphor particles 65 (60) were in surface contact with one another via the adhesion portions 80 (inter-phosphor particle adhesion portions 85) composed in such a manner that the nanoparticles of aluminum oxide were adhered to one another.

Moreover, as seen from FIGS. 7 and 8, it was found that, in the phosphor layer 40B of the inorganic wavelength converter 50B in Example 2, an inter-particle air gap 110 is formed between two or more adjacent phosphor particles 65 (60). Here, the inter-particle air gap 110 means an air gap formed between two or more adjacent phosphor particles 65 (60). As shown in FIGS. 7 and 8, in usual, the inter-particle air gap 110 is formed between three or more adjacent phosphor particles 65 (60).

As shown in FIGS. 7 and 8, the inter-particle air gap 110 of the phosphor layer 40B has an equivalent circle diameter as large as 1 μm or more. Here, the equivalent circle diameter means a diameter of a circle with the same area as an area within an outline of the inter-particle air gap 110 in the SEM. Note that a reason why the inter-particle air gap 110 of the phosphor layer 40B is large is considered to be that a particle size of the phosphor particles 65 (60) is large.

Since the phosphor layer 40B has the inter-particle air gap 110 in which the equivalent circle diameter is as large as 1 μm or more, the inorganic wavelength converter 50B is capable of obtaining light that is approximate to complete incoherent and suitable for use in illumination light. This is considered to be because the large inter-particle air gap 110 in the phosphor layer 40B scatters the laser beam with strong directivity, whereby interference of the laser beam can be suppressed.

[Observation of Fracture Surface of Inorganic Wavelength Converter 50B]

Figure 9:
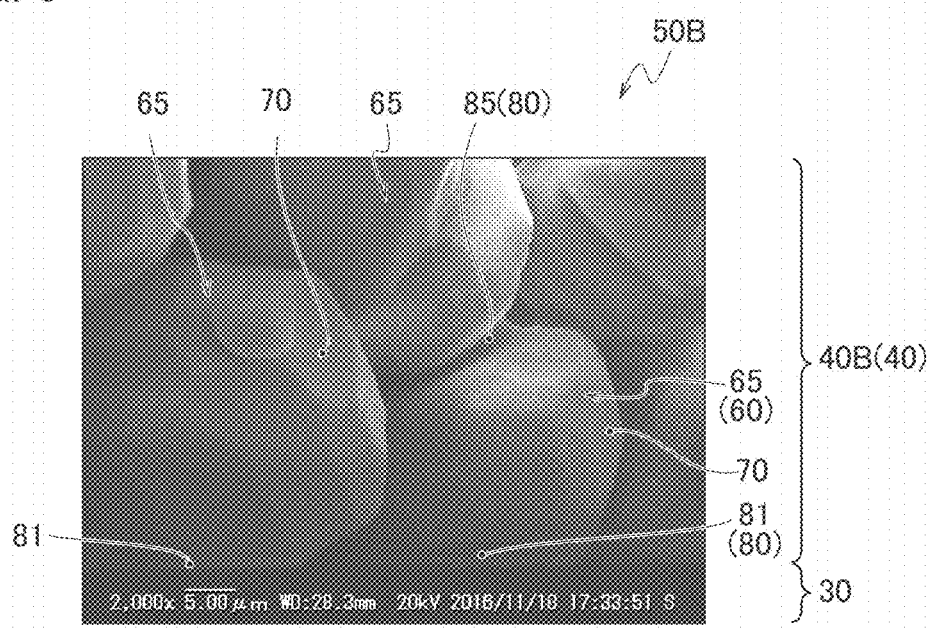
FIG. 9 is an example of a SEM picture of a fracture surface fractured along a thickness direction of the wavelength converter that composes the light emitting device according to Example 2.
Figure 10:
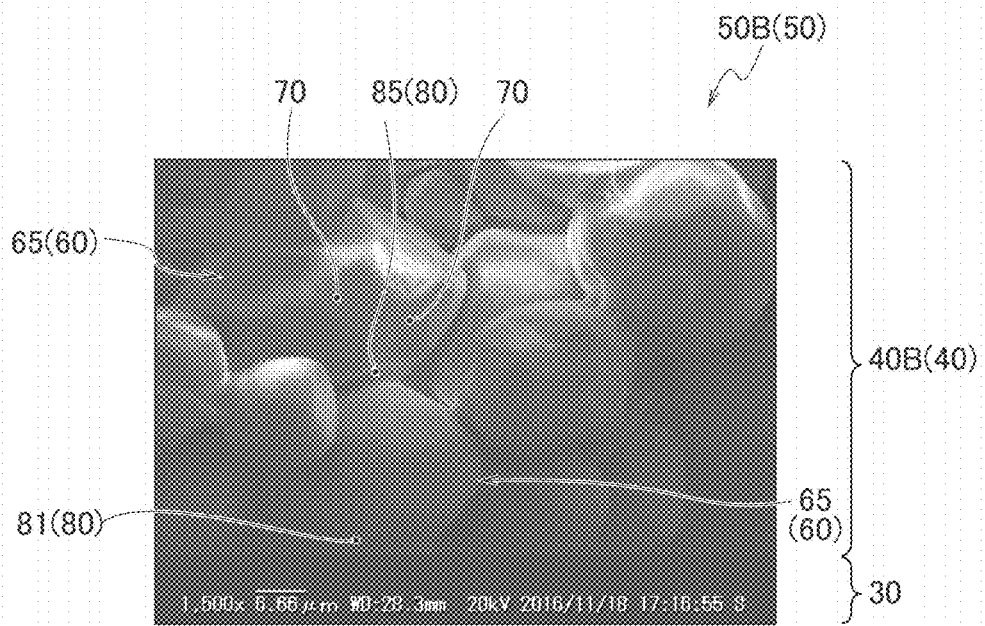
FIG. 10 is an example of a SEM picture of the fracture surface fractured along the thickness direction of the wavelength converter that composes the light emitting device according to Example 2.
Figure 11:
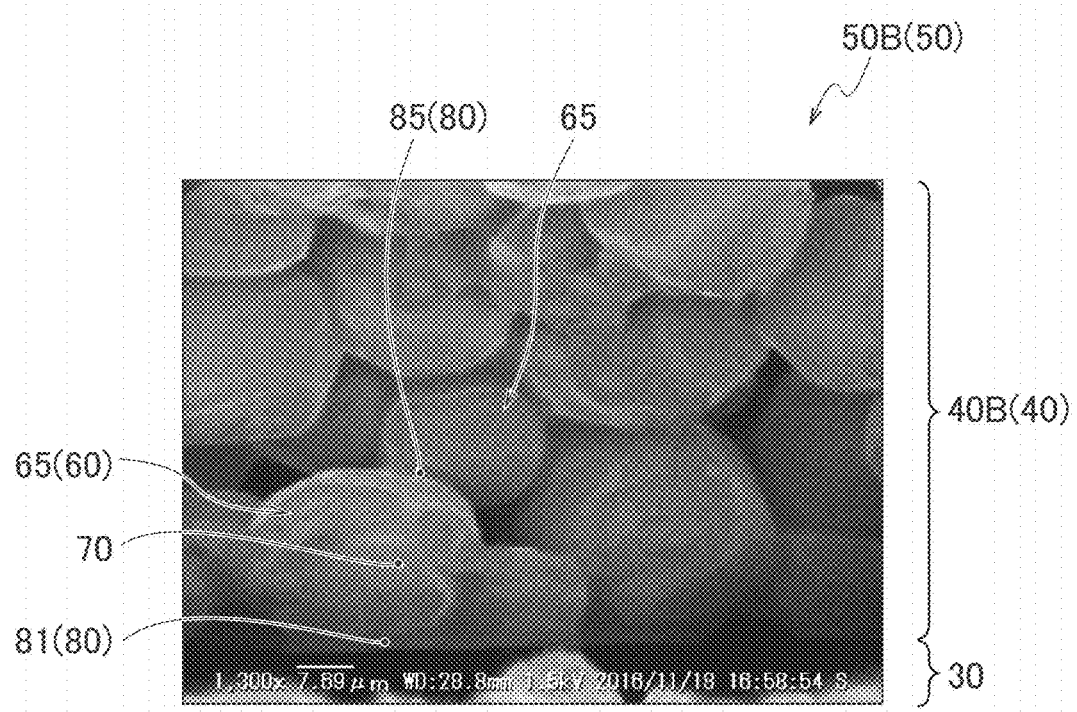
FIG. 11 is an example of a SEM picture of the fracture surface fractured along the thickness direction of the wavelength converter that composes the light emitting device according to Example 2.

A fracture surface of the inorganic wavelength converters was observed by a scanning electron microscope (SEM). FIGS. 9 to 11 are examples of SEM pictures of a fracture surface of the wavelength converter that composes the light emitting device according to Example 2. Specifically, each of FIGS. 9 to 11 is an example of a SEM picture of the fracture surface fractured along a thickness direction of the wavelength converter 50B (50) that composes the light emitting device according to Example 2.

As seen from FIGS. 9 to 11, it was found that the inorganic wavelength converter 50B (50) in Example 2 includes: the metal substrate 30; and the phosphor layer 40B (40) composed in such a manner that a large number of the phosphor particles 60 were adhered onto the flat surface 32 of the metal substrate 30. Moreover, it was found that, in the inorganic wavelength converter 50B, the facets 70 of the phosphor particles 65 (60) and the flat surface 32 of the metal substrate 30 were in surface contact with each other via the adhesion portions 80 (substrate-phosphor adhesion portions 81) composed in such a manner that the nanoparticles of ZnO and MoO$_3$ were adhered to one another. Furthermore, as seen from FIGS. 9 to 11, t was found that, in the inorganic wavelength converter 50B in Example 2, the facets 70 of the adjacent phosphor particles 65 were in surface contact with one another via the adhesion portions 80 (inter-phosphor particle adhesion portions 85) composed in such a manner that the nanoparticles of ZnO and MoO$_3$ were adhered to one another.

As seen from FIGS. 9 to 11, t was found that, in the inorganic wavelength converter 50B (50) in Example 2, thick heat dissipation paths generated by the surface contact were formed between the phosphor particles 65 and the metal substrate 30 and between the adjacent phosphor particles 65. It is considered easy to lower the temperature of the inorganic wavelength converter 50B in Example 2 since the inorganic wavelength converter 50A becomes a highly thermal conductive inorganic wavelength converter by the thick heat dissipation paths due to the surface contact and it becomes easy to dissipate the heat, which is generated in the phosphor layer, to the metal substrate and the heat sink.

[Example 3]<Formation of Phosphor Film by ZnO Sol-Gel>

(Preparation of Mixed Solution)

First, YAG phosphor powder (YAG phosphor powder D) with a median particle size D$_{50}$ of 37 μm was prepared. Note that the YAG phosphor powder D was synthesized by an orthodox solid phase reaction. Phosphor particles of the YAG phosphor powder D had facets.

Moreover, zinc acetate dihydrate was dispersed in alcohol (methanol), whereby a sol-gel solution in which a concentration of zinc acetate (CH$_3$COO)$_2$Zn.2H$_2$O was 10% by mass was prepared.

Thereafter, 1.0 g of the above YAG phosphor powder D and 0.5 g of the above sol-gel solution were mixed with each other, whereby a mixed solution (mixed solution M4) was obtained.

(Fabrication of Inorganic Wavelength Converter)

Aluminum alloy-made metal substrates with a size of 20 mm in length×20 mm in width and a thickness of 0.5 mm were arrayed continuously, and a Kapton tape was pasted onto a surface of each of the metal substrates, whereby low walls were formed. Then, the mixed solution M4 was dropped onto a portion surrounded by the low walls, and the mixed solution M4 was applied to a predetermined area on the metal substrate by an applicator using bar coating.

The applied mixed solution M4 was heated at 100° C. for 1 hour using a hot plate, thereby evaporating alcohol, whereby a dried body of the mixed solution M4 was obtained. Moreover, this dried body was sintered by being heated at 350° C. for 5 hours using the hot plate.

In this way, obtained was an inorganic wavelength converter composed in such a manner that a thick phosphor layer composed of the YAG phosphor and the nanoparticles of ZnO was formed on the metal substrate.

Three types of the inorganic wavelength converters were fabricated so that thicknesses of the thick phosphor layers thereof differed from one another. When the thicknesses of the phosphor layers on the metal substrates were measured by the stylus profiling system DEKTAK (Bruker), the thicknesses of three types of such sample phosphor layers were 92 to 140 μm.

[Example 4]<Formation of Phosphor Film by ZnO Sol-Gel+ZnO Nanoparticles>

(Preparation of Mixed Solution)

First, the YAG phosphor powder (YAG phosphor powder C) with a median particle size D$_{50}$ of 37 μm, the YAG phosphor powder having been used in Example 2, was prepared.

Moreover, as nanoparticles, nanoparticles of zinc oxide (ZnO) with an average particle size of 100 nm were prepared. Next, these nanoparticles were dispersed in water, and an aqueous suspension (nanoparticle aqueous slurry) with a solid content of 30% by mass was prepared.

Furthermore, zinc acetate dihydrate was dispersed in alcohol (methanol), whereby a sol-gel solution in which a concentration of (CH$_3$COO)$_2$Zn.2H$_2$O was 10% by mass was prepared.

Thereafter, 1.0 g of the YAG phosphor powder C, 0.5 g of the sol-gel solution and 0.5 g of the above suspension were mixed with one another, whereby a mixed solution (mixed solution M5) was obtained.

(Fabrication of Inorganic Wavelength Converter)

Aluminum alloy-made metal substrates with a size of 20 mm in length×20 mm in width and a thickness of 0.5 μmm were arrayed continuously, and a Kapton tape was pasted onto a surface of each of the metal substrates, whereby low walls were formed. Then, the mixed solution M5 was dropped onto a portion surrounded by the low walls, and the mixed solution M5 was applied to a predetermined area on the metal substrate by an applicator using bar coating.

The applied mixed solution M5 was heated at 100° C. for 1 hour using a hot plate, thereby evaporating water and alcohol, whereby a dried body of the mixed solution M5 was obtained. Moreover, this dried body was sintered by being heated at 350° C. for 5 hours using the hot plate.

In this way, obtained was an inorganic wavelength converter composed in such a manner that a thick phosphor layer composed of the YAG phosphor and the nanoparticles of ZnO was formed on the metal substrate.

Three types of the inorganic wavelength converters were fabricated so that thicknesses of the thick phosphor layers thereof differed from one another. When the thicknesses of the phosphor layers on the metal substrates were measured by the stylus profiling system DEKTAK (Bruker), the thicknesses of three types of such sample phosphor layers were 92 to 140 μm.

The entire contents of Japanese Patent Application No. 2016-046722 (filed on: Mar. 10, 2016) are incorporated herein by reference.

Although the contents of this embodiment have been described above in accordance with the examples, it is obvious to those skilled in the art that this embodiment is not limited to the description of these and that various modifications and improvements are possible.

INDUSTRIAL APPLICABILITY

The manufacturing cost of the light emitting device of the present invention is low, and at high power, the light emitting device of the present invention can radiate white light suitable for use in illumination.

REFERENCE SIGNS LIST

1 LIGHT EMITTING DEVICE
10 SOLID-STATE LIGHT EMITTING ELEMENT
30 SUBSTRATE
32 FLAT SURFACE
40, 40a, 40B, 90 PHOSPHOR LAYER
41 PHOSPHOR-APPLIED LIQUID LAYER

42 PHOSPHOR-APPLIED LIQUID DRIED BODY LAYER
50, 50A, 50B WAVELENGTH CONVERTER
60 PHOSPHOR PARTICLE
65 POLYHEDRAL PHOSPHOR PARTICLE
70) FACET
80, 180 ADHESION PORTION
81, 181 SUBSTRATE-PHOSPHOR ADHESION PORTION
85, 185 INTER-PHOSPHOR PARTICLE ADHESION PORTION
95 PHOSPHOR PARTICLE
110 INTER-PARTICLE AIR GAP

The invention claimed is:

1. A light emitting device comprising:
a substrate; and
a phosphor layer composed in such a manner that a large number of phosphor particles are adhered onto a flat surface of the substrate,
wherein at least one of the phosphor particles is a polyhedral phosphor particle that is monodispersed, is derived from a crystal structure of garnet and has facets, and
a median particle size $D_{50}$ of the polyhedral phosphor particle is 30 μm or more and a maximum thickness of the phosphor layer is or less.

2. The light emitting device according to claim 1, at least one of the phosphor particles adhered onto the flat surface of the substrate is the polyhedral phosphor particle that is monodispersed, is derived from the crystal structure of the garnet, and has the facets.

3. The light emitting device according to claim 1, wherein, in at least one of the polyhedral phosphor particles adhered onto the flat surface of the substrate, an area of at least one of the facets exceeds 200 μm².

4. The light emitting device according to claim 1, wherein the facets of the polyhedral phosphor particles and the flat surface of the substrate are adhered to each other in a surface contact manner.

5. The light emitting device according to claim 4, wherein a plurality of portions where the facets of the polyhedral phosphor particles and the flat surface of the substrate are adhered to each other in a surface contact manner are provided.

6. The light emitting device according to claim 1, wherein the facets of the adjacent polyhedral phosphor particles are adhered to one another in a surface contact manner.

7. The light emitting device according to claim 1, further comprising:
substrate-phosphor adhesion portions which adhere the flat surface of the substrate and the facets of the polyhedral phosphor particles in the phosphor layer to each other,
wherein the substrate-phosphor adhesion portions are made of an inorganic binding agent.

8. The light emitting device according to claim 1, further comprising:
inter-phosphor particle adhesion portions which adhere the facets of the adjacent polyhedral phosphor particles to one another,
wherein the inter-phosphor particle adhesion portions are made of an inorganic binding agent.

9. The light emitting device according to claim 7, wherein the inorganic binding agent is nanoparticles made of at least one inorganic oxide selected from the group consisting of $Al_2O_3$, $ZnO$, $MoO_3$ and $ZnMoO_4$.

10. The light emitting device according to claim 7, wherein the inorganic binding agent is nanoparticles with a median particle size $D_{50}$ of 1 nm or more and 100 nm or less.

11. The light emitting device according to claim 1, wherein the phosphor particles are excited by a laser beam.

* * * * *